United States Patent [19]
Wada et al.

[11] Patent Number: 4,947,374
[45] Date of Patent: Aug. 7, 1990

[54] SEMICONDUCTOR MEMEORY DEVICE IN WHICH WRITING IS INHIBITED IN ADDRESS SKEW PERIOD AND CONTROLLING METHOD THEREOF

[75] Inventors: Tomohisa Wada; Shuji Murakami, both of Hyogo, Japan

[73] Assignee: Mitsubishi Denki Kabushiki Kaisha, Tokyo, Japan

[21] Appl. No.: 191,115

[22] Filed: May 6, 1988

[30] Foreign Application Priority Data

May 12, 1987 [JP] Japan ............................... 62-115292
Nov. 26, 1987 [JP] Japan ............................... 62-297977

[51] Int. Cl.⁵ .............................................. G11C 7/00
[52] U.S. Cl. ................................... 365/195; 365/233.5
[58] Field of Search ............... 365/194, 195, 233, 189, 365/233.5, 189.05, 189.06

[56] References Cited

U.S. PATENT DOCUMENTS

| | | | |
|---|---|---|---|
| 4,272,832 | 6/1981 | Ito ..................................... | 365/233 X |
| 4,337,523 | 6/1982 | Holta et al. ......................... | 365/194 |
| 4,480,321 | 10/1984 | Aoyama ............................ | 365/200 X |
| 4,616,344 | 10/1986 | Noguchi et al. .................. | 365/194 X |
| 4,707,809 | 11/1987 | Ando ............................... | 365/195 X |
| 4,744,063 | 5/1988 | Ohtami et al. ....................... | 365/233 |
| 4,766,572 | 8/1988 | Kobayashi ....................... | 365/233 X |
| 4,802,129 | 1/1989 | Hoekstra et al. ................. | 365/194 X |

FOREIGN PATENT DOCUMENTS 140688 8/1984 Japan .
117491 6/1985 Japan .
49676 10/1987 Japan .

*Primary Examiner*—Stuart N. Hecker
*Assistant Examiner*—Andrew L. Sniezek
*Attorney, Agent, or Firm*—Lowe, Price, Leblanc, Becker & Shur

[57] ABSTRACT

In a static random access memory, when address signals change, one-shot pulses are responsively generated. A detection signal obtained by ORing the one-shot pulses is employed as an equalize signal. Potentials of a bit line pair is equalized in response to the equalize signal. A write inhibiting signal having a pulse width larger than that of the equalize signal is generated by a pulse width increasing circuit. A write operation of data is inhibited in response to the write inhibiting signal.

17 Claims, 18 Drawing Sheets

SEMICONDUCTOR MEMEORY DEVICE IN WHICH WRITING IS INHIBITED IN ADDRESS SKEW PERIOD AND CONTROLLING METHOD THEREOF

BACKGROUND OF THE INVENTION

1. Field of the Invention

The present invention relates generally to semiconductor memory devices and more particularly, to semiconductor memory devices in which writing is inhibited in an address skew period and controlling method thereof.

2. Description of the Prior Art

FIG. 1 is a block diagram showing schematic structure of an example of a conventional static random access memory (referred to as SRAM hereinafter).

A memory cell array 1 comprises a plurality of word lines, a plurality of bit line pairs arranged intersecting with the plurality of word lines, and a plurality of memory cells each arranged at each of intersections thereof. The word lines are connected to an X decoder 3 and the bit line pairs are connected to a Y decoder 5. An X address buffer 2 applies an address signal AX comprising a plurality of address signals externally applied, as an address signal ax, to the X decoder 3 and an address transition detector 20. The X decoder 3 is responsive to the address signal ax applied from the X address buffer 2 for selecting one of the plurality of word lines. A Y address buffer 4 applies an address signal AY comprising a plurality of address signals externally applied, an address signal ay, to the Y decoder 5 and the address transition detector 20. The Y decoder 5 is responsive to the Y address signal ay applied from the Y address buffer 4 for selecting one of the plurality of bit line pairs. Data is read out or written from or to a memory cell at an intersection of the selected word line and the selected bit line pair. A read/write control circuit 10 operates a read circuit 6 when a write enable signal $\overline{WE}$ is at an "H" level while operating a write circuit 8 when the write enable signal $\overline{WE}$ is at an "L" level. At the time of reading out data, the data stored in the memory cell selected in the above described manner is outputted through a data output buffer 7 by the read circuit 6. At the time of writing data, data externally applied to a data input buffer 9 is inputted to the memory cell selected in the above described manner by the write circuit 8.

The address transition detector 20 detects the change of the address signals ax and ay to generate a detection signal GATD. The detection signal GATD is applied to the memory cell array 1 as an equalize signal BLEQ.

FIG. 2A is a circuit diagram showing structure of the memory cell array 1 shown in FIG. 1, and FIG. 2B is a circuit diagram showing a memory cell included in the memory cell array 1.

In FIG. 2A, a plurality of word lines WL are arranged in the memory cell array 1, a plurality of bit line pairs BL and $\overline{BL}$ being arranged intersecting therewith. A memory cell MC is provided at each of intersections of the plurality of word lines WL and the plurality of bit line pairs BL and $\overline{BL}$. The plurality of word lines WL are connected to the X decoder 3. The bit lines BL and $\overline{BL}$ are connected to a power-supply potential through bit line load constituting N channel MOSFETs Q6 and Q7, respectively. An equalizing N channel MOSFET Q5 is connected between the bit lines BL and $\overline{BL}$. The equalizing N channel MOSFET Q5 has its gate coupled to an equalize signal BLEQ. The bit lines BL and $\overline{BL}$ are connected to a pair of input/output lines I/O and $\overline{I/O}$ through N channel MOSFETs Q8 and Q9, respectively. The MOSFETs Q8 and Q9 have their gates connected to the Y decoder 5. A set of MOSFETs Q8 and Q9 is turned on by the Y decoder 5, so that data on the bit line pair BL and $\overline{BL}$ connected to the MOSFETs Q8 and Q9 are read out to the input/output lines I/O and $\overline{I/O}$. The potential difference between the input/output lines I/O and $\overline{I/O}$ is amplified by a sense amplifier SA and outputted through a data bus DB and a buffer BF. An equalizing N channel MOSFET Q10 is connected between the input/output lines I/O and $\overline{I/O}$. The equalizing N channel MOSFET Q10 has its gate coupled to an equalize signal IOEQ. The MOSFETs Q5 and Q10 are turned on in response to the equalize signals BLEQ and IOEQ before reading out or writing data, so that potentials of the bit lines BL and $\overline{BL}$ and potentials of the input/output lines I/O and $\overline{I/O}$ are equalized, respectively. The equalize signals BLEQ and IOEQ are the same signals as the detection signal GATD from the address transition detector 20 or signals obtained by waveform-shaping the detection signal GATD.

A precharging circuit 11 is connected to the data bus DB. The precharging circuit 11 is responsive to a precharging signal PR for precharging the data bus DB to an intermediate potential between the "H" level and the "L" level. The precharging signal PR is the detection signal GATD or a signal obtained by waveform-shaping the detection signal GATD, similarly to the equalize signals BLEQ and IOEQ.

In FIG. 2B, a memory cell MC includes N channel MOSFETs Q1 to Q4 and resistances R1 and R2. The resistance R1 is coupled between the power-supply potential and a node n1, the resistance R2 is coupled between the power-supply potential and a node n2. The MOSFET Q1 is coupled between the node n1 and a ground potential, and has its gate connected to the node n2. The MOSFET Q2 is coupled between the node n2 and the ground potential, and has its gate connected to the node n1. The MOSFET Q3 is connected between the node n1 and the bit line BL, and has its gate connected to the word line WL. The MOSFET Q4 is connected between the node n2 and the bit line $\overline{BL}$, and has its gate connected to the word line WL.

Complementary data are stored in the nodes n1 and n2. When a potential of the word line WL attains the "H" level, the MOSFETs Q3 and Q4 are turned on. As a result, at the time of a read operation, the data stored in the nodes n1 and n2 are read out to the bit lines BL and $\overline{BL}$, respectively. On the other hand, at the time of a write operation, the data on the bit lines BL and $\overline{BL}$ are written to the nodes n1 and n2, respectively.

FIG. 2C is a block diagram showing structure of the address transition detector 20 shown in FIG. 1.

A plurality of ATD pulse generators 201 are provided corresponding to a plurality of address signals A1 to An included in the address signals ax and ay. The ATD pulse generators 201 are responsive to the change of the address signals A1 to An for generating one-shot pulses ATD1 to ATDn, respectively. An OR circuit 202 ORs outputs of the ATD pulse generators 201, to output the same as the detection signal GATD. The detection signal GATD may be obtained by ORing signals waveform-shaped by a buffer.

FIG. 3 is a waveform diagram showing the operation timing of the X address buffer 2, the X decoder 3, the Y address buffer 4 and the Y decoder 5.

When the address signal AX changes, the address signal ax outputted from the X address buffer 2 responsively changes. An output of the X decoder 3 also changes in response to the change of the address signal ax, so that another word line is selected. On this occasion, a one-shot pulse ATD is generated in the address transition detector 20 in response to the change of the address signal ax. In the same manner, when the address signal AY changes, the address signal ay outputted from the Y address buffer 4 responsively changes. An output of the Y decoder 5 changes in response to the change of the address signal ay, so that another bit line pair is selected. On this occasion, a one-shot pulse ATD is generated in the address transition detector 20 in response to the change of the address signal ay.

FIG. 4 is a waveform diagram showing an example of the timing for writing in the above described SRAM.

It is assumed that two address signals A1 and A2, of a plurality of address signals included in the address signal ax and ay change. After the address signals A1 and A2 change, the write enable signal $\overline{WE}$ falls to the "L" level, so that a write operation is performed. In the period during which the write enable signal $\overline{WE}$ is at the "L" level, data is written to the selected memory cell, so that data at the rise time point tw of the write enable signal $\overline{WE}$ remains in the memory cell.

Meanwhile, the address signal includes address skew represented by a period t1, and the write enable signal $\overline{WE}$ includes jitter represented by periods t3 and t4. Address skew means a shift of timing of the change of a plurality of address signals depending on the system precision when the address signals change. t3 is the maximum value of a jitter period at the time of the change of the write enable signal $\overline{WE}$ from the "H" level to the "L" level, and t4 is the maximum value of a jitter period at the time of the change of the write enable signal $\overline{WE}$ from the "L" level to the "H" level. Jitter means that a signal changes irregularly. Thus, in practice, when the SRAM is carried on a board to be employed as a system, a cycle time Tc of the system becomes as follows, even if the address setup time t5 and the write recovery time t6 which are specification values of the SRAM are assumed to be 0 ns, respectively;

$$Tc = t1 + t3 + t2 + t4$$

where t2 denotes a write pulse width which is a specification value of the SRAM. In particular, in the SRAM which operates at very high speed, the ratio of the jitter periods t3 and t4 to the cycle time Tc is increased. The high speed characteristic is lost due to the jitter periods t3 and t4.

When data is written with the write enable signal $\overline{WE}$ being fixed in advance at the "L" level, i.e., in a write state, the jitter periods t3 and t4 can be also neglected. If this method is used, data stored in a memory cell selected transiently in the address skew period t1 may be reloaded. For example, in FIG. 4, data can be written to a memory cell selected by the address signal A1 after change and the address signal A2 before change in the address skew period t1.

One solution to this problem includes a method in which the change of address signal is detected to generate a one-shot pulse ATD and a write operation in a chip is inhibited by using the pulse. FIG. 5 illustrates the operation timing of the SRAM using this method.

In the SRAM using this method, the same signal as the detection signal GATD of the address transition detector 20 is applied to the read/write control circuit 10 as a write inhibiting signal WI as shown in FIG. 1.

In FIG. 5, address skew represented by the period t1 occurs between the address signals A1 and A2. The write enable signal $\overline{WE}$ has been fixed at the "L" level before the change of address signal. In the address transition detector 20, a one-shot pulse ATD1 is generated in response to the change of the address signal A1, and a one-shot pulse ATD2 is generated in response to the change of the address signal A2. The address transition detector 20 outputs a detection signal GATD obtained by ORing the one-shot pulses ATD1 and ATD2. The same signal as the detection signal GATD is applied to the equalizing transistor Q5 (in FIG. 2A) in the memory cell array 1 as an equalize signal BLEQ, as well as to the read/write control circuit 10 as a write inhibiting signal WI. Although in FIG. 1, the equalize signal BLEQ and the write inhibiting signal WI are almost the same as the detection signal GATD, the signals may be signals obtained by waveform-shaping and increasing the driving ability, or the like of the detection signal GATD by using a buffer or the like. The read/write control circuit 10 applies to the write circuit 8 an internal write signal WE obtained by inverting the write inhibiting signal WI. A write operation is inhibited when the internal write signal WE is at the "L" level while being performed when it is at the "H" level. Thus, in the address skew period t1, the write operation is inhibited, so that data stored in a memory cell selected transiently in the period t1 can be prevented from being destroyed.

However, as shown in FIG. 6, if an address skew period t1' is longer (t1' > t1), the period at the "H" level of the detection signal GATD obtained by the one-shot pulses ATD1 and ATD2 is divided into two, so that the period t7 at the "L" level appears during the period at the "H" level. As a result, the period at the "H" level of the internal write signal WE appears in the address skew period t1', so that data is erroneously written to a memory cell transiently selected. Consequently, data stored in the memory cell may be destroyed.

In order to solve this problem, it is considered that in the address transition detector 20, the one-shot pulse ATD having a large width or the detection signal GATD having a large width is adapted to be generated. However, if the detection signal GATD is long, the width of the equalize signal BLEQ is increased, so that access times in the SRAM become slow.

SUMMARY OF THE INVENTION

An object of the present invention is to provide a semiconductor memory device with fast access times.

Another object of the present invention is to provide a semiconductor memory device in which a write operation can be performed at high speed without erroneously writing data to a memory cell transiently selected in an address skew period.

Still another object of the present invention is to provide a semiconductor memory device in which the write operation is completely inhibited in the address skew period in an operation in which a write enable signal externally applied is fixed in a write state before the change of address signal.

A further object of the present invention is to provide a semiconductor memory device in which a write time period is ensured during which the write operation is performed at high speed without erroneously writing data to another memory cell in the operation in which the write enable signal externally applied is fixed in the write state before the change of address signal and the write operation is normally performed in an operation in which the write enable signal is fixed in the write state after the change in address signal.

In order to attain the above described objects, a semiconductor memory device according to the present invention comprises a plurality of memory cells, selecting means, writing means, a plurality of address transition detecting means, first signal generating means, second signal generating means and write inhibiting means. The selecting means is responsive to a plurality of address signals externally applied for selecting any of the plurality of memory cells. The writing means writes data to a memory cell selected by the selecting means. Each of the plurality of address transition detecting means is responsive to each of the plurality of address signals for generating a one-shot pulse. The first signal generating means is responsive to the one-shot pulses from the plurality of address transition detecting means for generating a first signal. The second signal generating means is responsive to the first signal from the first signal generating means for increasing the pulse width of the first signal and outputting the same as a second signal. The write inhibiting means is responsive to the second signal from the second signal generating means for rendering the writing means inactive.

In the semiconductor memory device according to the present invention, since the second signal for inhibiting the write operation by the writing means is increased, the write state in a chip is inhibited even if relatively large address skew occurs, so that erroneous writing is prevented without delay of a read operation.

In accordance with another aspect of the present invention, the semiconductor memory device further comprises inhibit releasing signal generating means responsive to the start of the write enable signal externally applied for generating an inhibit releasing signal having a predetermined pulse width. The write inhibiting means renders the writing means active in response to the inhibit releasing signal and the end of the first signal while rendering the writing means inactive in response to the end of the write enable signal.

Thus, when the write enable signal externally applied is applied after the change of address signal, the inhibit releasing signal having a predetermined pulse width is generated, so that the writing means operates in response to the end of the first signal having a pulse width smaller than the pulse width of the second signal. As a result, the write time period is ensured during which a normal write operation is performed.

An SRAM in which a write operation is inhibited by a pulse generated in response to the change of address signal is described in, for example, Japanese Patent Publication No. 49676/1987 filed Aug. 24, 1981 by FUJITSU LIMITED and Japanese Patent Laying-Open Gazette No. 140688/1984 filed Jan. 31, 1983 by Hitachi, Ltd. In addition, an SRAM in which an output of a write driver in a chip is inhibited by a pulse generated in response to the change in address signal, which is not directly related to the present invention, is described in Japanese Patent Laying-Open Gazette No. 117491/1985 filed Nov. 29, 1983 by NEC IC Micon System Corp.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
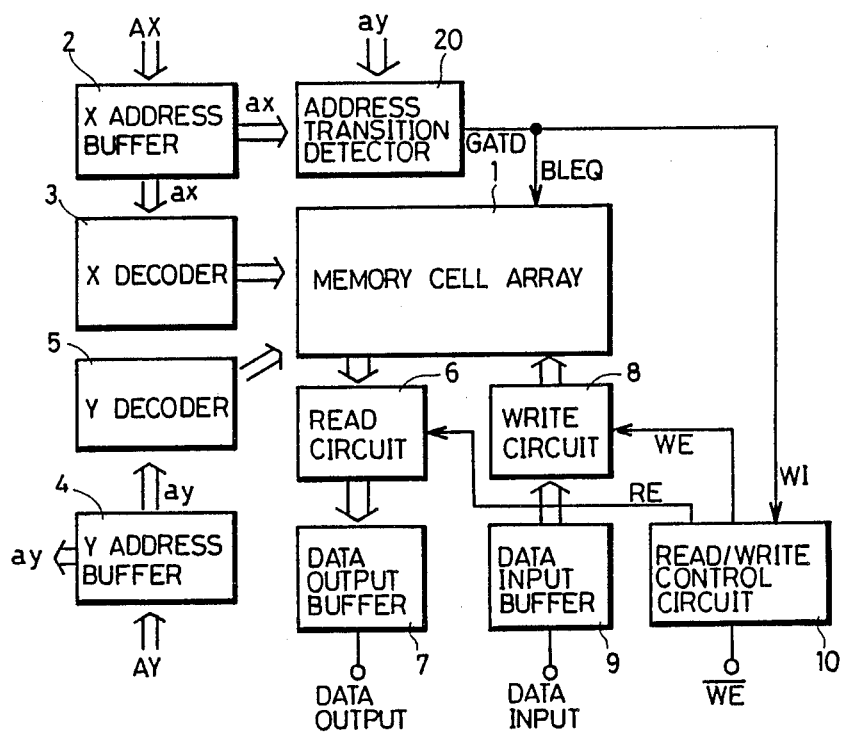
FIG. 1 is a block diagram showing structure of a conventional SRAM.

Referring now to the drawings, embodiments of the present invention will be described.

Figure 7:
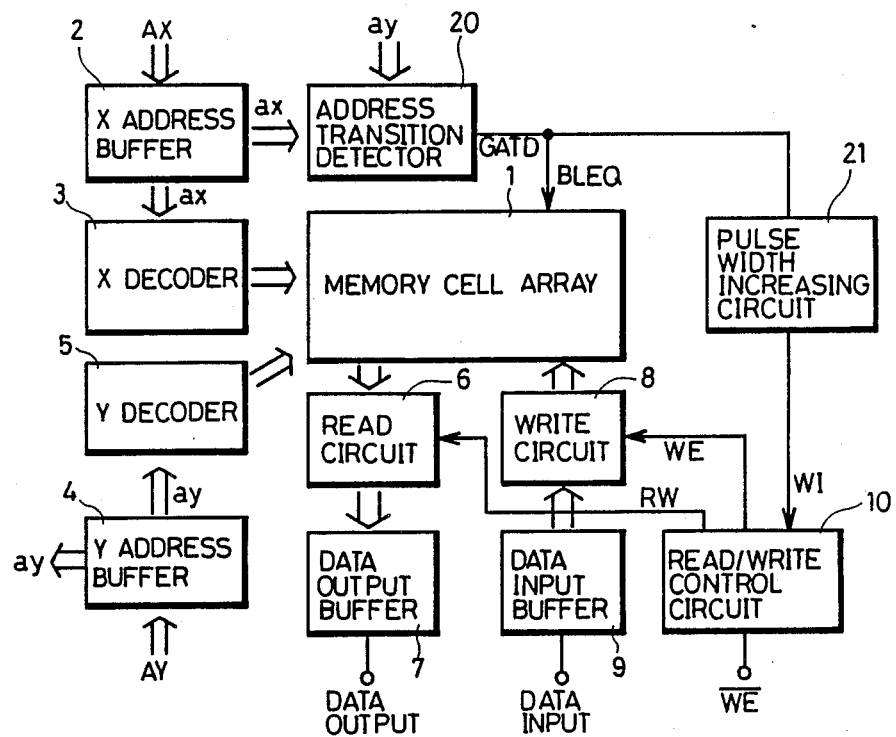
FIG. 7 is a block diagram showing structure of an SRAM according to an embodiment of the present invention.

FIG. 7 is a block diagram showing structure of an SRAM according to an embodiment of the present invention. The SRAM shown in FIG. 7 is provided with a pulse width increasing circuit 21. The pulse width increasing circuit 21 generates a write inhibiting signal WI having a pulse width longer than that of an equalize signal BLEQ and applies the same to a read-/write control circuit 10. Structure of the other portions of the SRAM shown in FIG. 7 is the same as that of the conventional SRAM shown in FIG. 1. In addition, structure of a memory cell array 1, structure of memory cells MC and structure of an address transition detector 20 are the same as those shown in FIGS. 2A, 2B and 2C, respectively. The portions shown in FIG. 7 are formed on the same chip.

Figure 8:
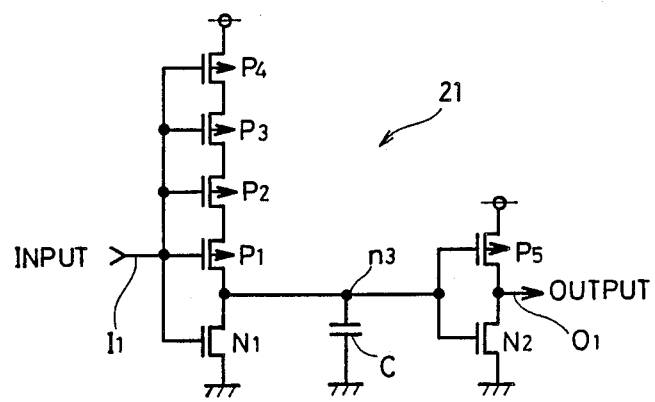
FIG. 8 is a circuit diagram showing structure of a pulse width increasing circuit shown in FIG. 7.
Figure 9:
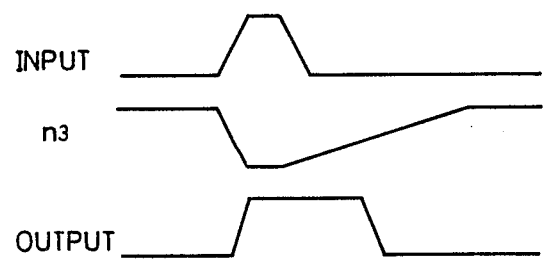
FIG. 9 is a timing chart for explaining an operation of the pulse width increasing circuit shown in FIG. 8.

FIG. 8 is a circuit diagram showing an example of structure of the pulse width increasing circuit 21 and FIG. 9 is a waveform diagram for explaining an operation of the pulse width increasing circuit 21.

In FIG. 8, the pulse width increasing circuit 21 comprises N channel MOSFETs N1 and N2, P channel MOSFETs P1 to P5 and a capacitance C. The MOSFETs P4, P3, P2 and P1 are coupled in series between a power-supply potential and a node n3, and have their gate connected to an input terminal I1. The MOSFET N1 is coupled between the node n3 and a ground potential, and has its gate connected to the input terminal I1. In addition, the capacitance C is coupled between the node n3 and the ground potential. The MOSFET P5 is coupled between the power-supply potential and an output terminal O1, and has its gate connected to the node n3. The MOSFET N2 is coupled between the output terminal O1 and the ground potential, and has its gate connected to the node n3. The MOSFETs P5 and N2 constitute an inverter.

The ability of the MOSFETs P1 to P4 to drive a potential of the node n3 to an "H" level is smaller than the ability of the MOSFET N1 to drive the potential of the node n3 to an "L" level. More specifically, since a single MOSFET is coupled between the ground potential and the node n3 while four MOSFETs are coupled between the power-supply potential and the node n3, an on-resistance between the power-supply potential and the node n3 becomes larger than an on-resistance between the ground potential and the node n3. Consequently, the rise time of the potential of the node n3 becomes longer than the fall time thereof. When a signal applied to the input terminal I1 rises to the "H" level, the MOSFET N1 is turned on and the MOSFETs P1 to P4 are turned off, so that the potential of the node n3 falls to the "L" level. When a signal applied to the input terminal I1 falls to the "L" level, the MOSFETs P1 to P4 are turned on and the MOSFET N1 is turned off, so that the potential of the node n3 gently rises to the "H" level, as shown in FIG. 9. A signal obtained by inverting the potential of the node 3 by the inverter is derived from the output terminal O1. Thus, the width of a pulse outputted from the output terminal O1 is increased, as compared with the width of a pulse applied to the input terminal I1.

Figure 10:
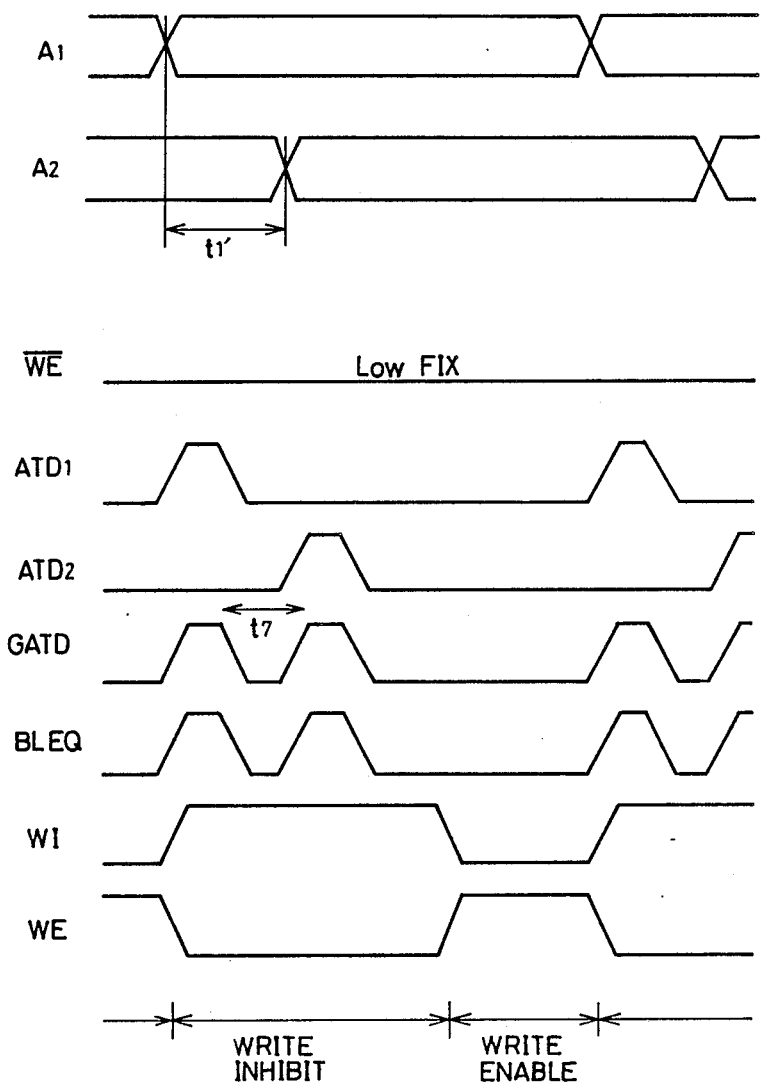
FIG. 10 is a timing chart for explaining an operation of the SRAM shown in FIG. 7.

Referring now to a timing chart of FIG. 10, description is made on a write operation of the SRAM according to the present embodiment.

Figure 4:
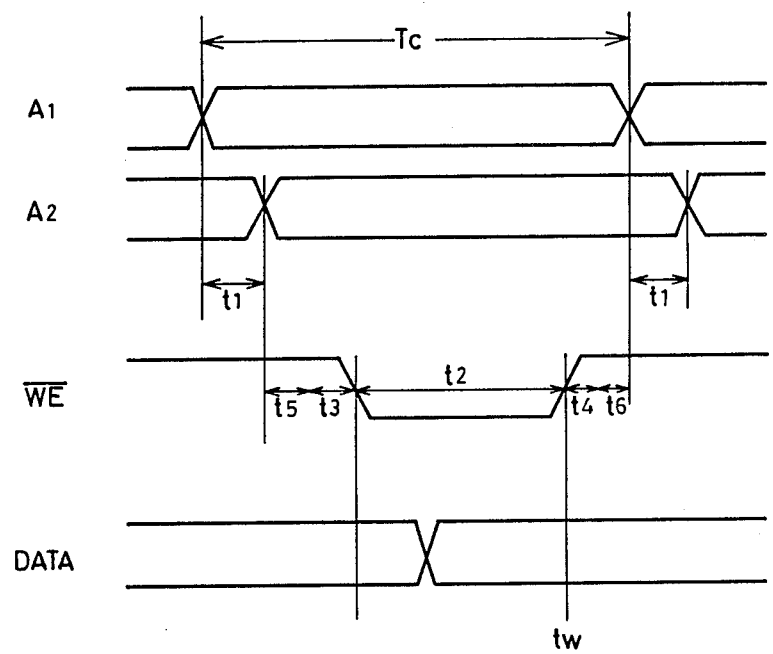
FIG. 4 is a timing chart for explaining an example of a write operation of the conventional SRAM.
Figure 5:
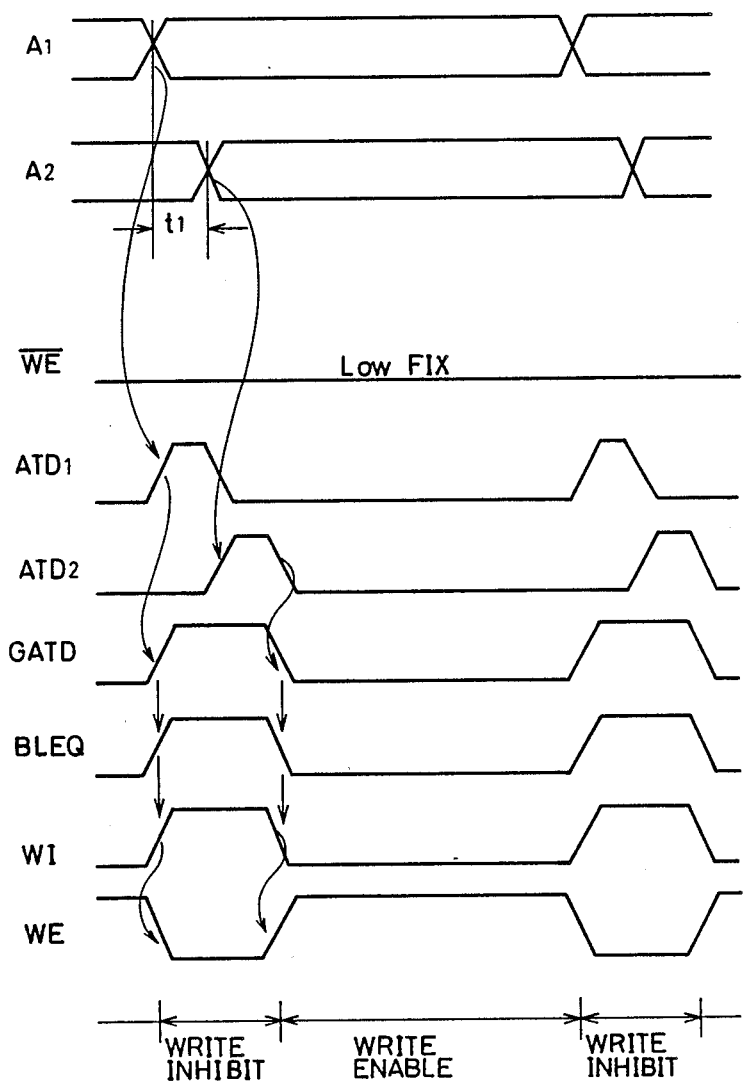
FIG. 5 is a timing chart for explaining another example of the write operation of the conventional SRAM.
Figure 6:
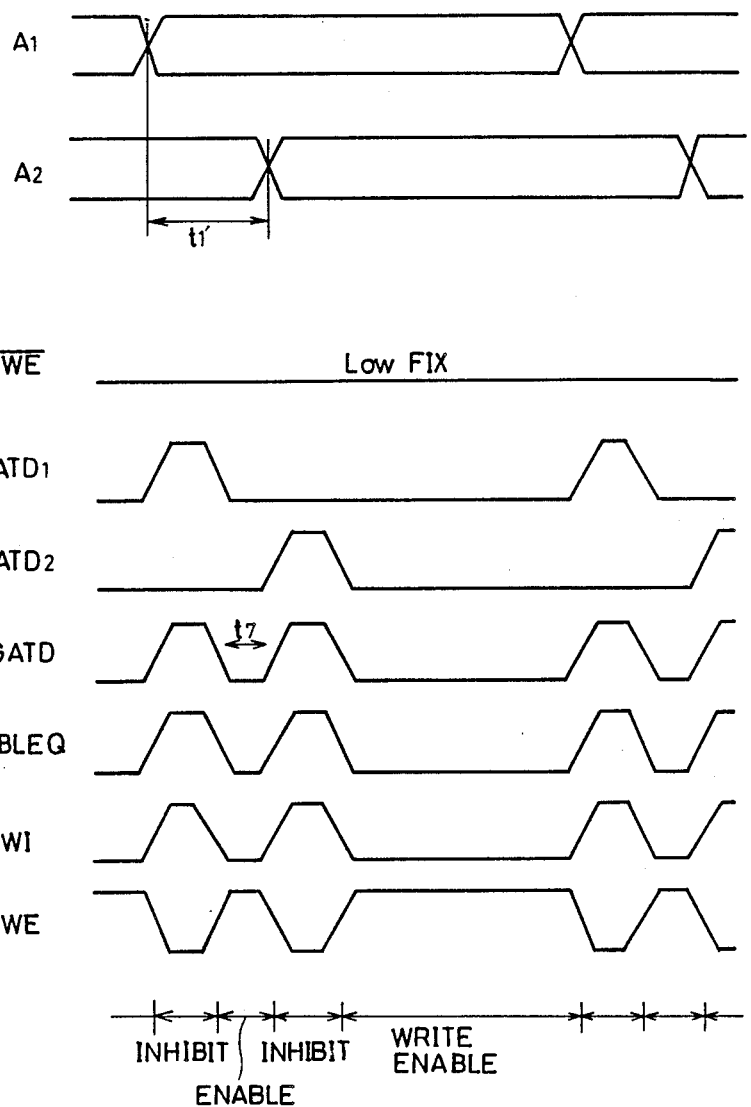
FIG. 6 is a timing chart showing a case in which an address skew period is long in the write operation shown in FIG. 5.

In this case, as in FIG. 4, it is assumed that two address signals A1 and A2, of a plurality of address signals included in address signals ax and ay change. Address skew represented by the period t1' occurs between the address signals A1 and A2. A write enable signal $\overline{WE}$ has been fixed at the "L" level before the change of the address signal. In the address transition detector 20, a one-shot pulse ATD1 is generated in response to the change of the address signal A1 and a one-shot pulse ATD2 is generated in response to the change of the address signal A2. The address transition detector 20 outputs a detection signal GATD obtained by ORing the one-shot pulses ATD1 and ATD2. If the address skew period t1' is long, the period at the "H" level of the detection signal GATD is divided into two as shown in FIG. 10, so that the period t7 at the "L" level appears during the period at the "H" level. An equalize signal BLEQ has the same waveform as that of the detection signal GATD. Thus, the time point at which equalizing of a bit line pair BL and $\overline{BL}$ is completed is the same as the timing in the conventional SRAM shown in FIGS. 5 and 6. Therefore, the access time is never delayed.

The pulse width increasing circuit 21 shown in FIG. 7 generates a write inhibiting signal WI having a pulse width larger than those of the detection signal GATD and the equalize signal BLEQ and applies the same to a read/write control circuit 10. The write inhibiting signal WI falls later than the detection signal GATD and the equalize signal BLEQ, as shown in FIG. 10. Consequently, two write inhibiting signals WI corresponding to the one-shot pulses ATD1 and ATD2 are overlapped with each other, to be a single long pulse having no period at the "L" level therein. The read/write control circuit 10 applies to a write circuit 8 an internal write signal WE obtained by inverting the write inhibiting signal WI. The write operation is inhibited when the internal write signal WE is at the "L" level while being performed when it is at the "H" level.

Thus, even if the address skew period t1' becomes longer, the write operation is inhibited in the period. As a result, data is never erroneously written to a memory cell MC transiently selected during the period t1'.

Thus, in the SRAM according to the present embodiment, if a write operation is performed in which a write enable signal has been fixed at the "L" level before the change of address signal, data is written to a desired memory cell MC with fast access times without destroying data in the other memory cells MC.

Although in the above described embodiment, the operation of the write circuit 8 is controlled by the internal write signal WE generated from the read/write control circuit 10 in response to the write inhibiting signal WI, the operation of the write circuit 8 may be controlled by the write inhibiting signal WI. More specifically, the operation of a write driver for driving the bit line pair BL and $\overline{BL}$ in the memory cell array 1 may be inhibited by the write inhibiting signal WI. Even in this case, the same effect as that of the above described embodiment is obtained.

Figure 2A:
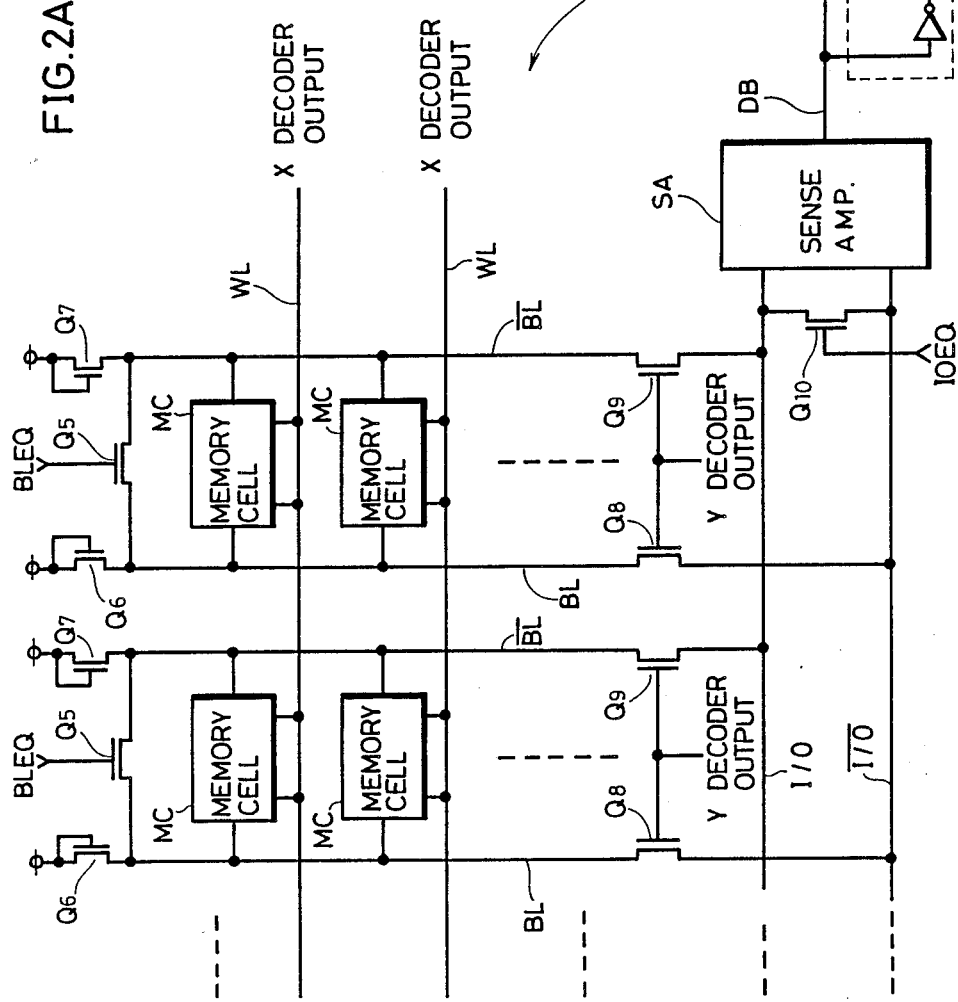
FIG. 2A is a circuit diagram showing structure of a memory cell array shown in FIGS. 1, 7 and 11.
Figure 2B:
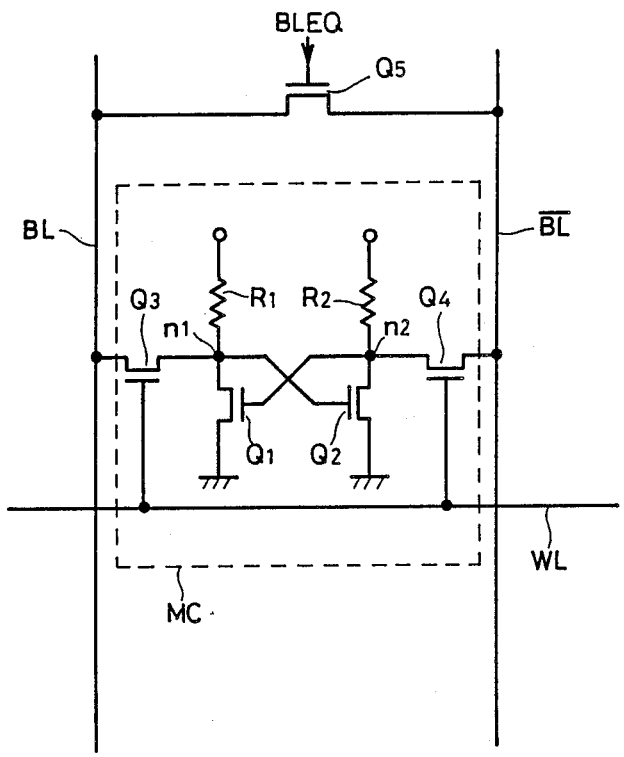
FIG. 2B is a circuit diagram showing structure of a memory cell shown in FIG. 2A.
Figure 2C:
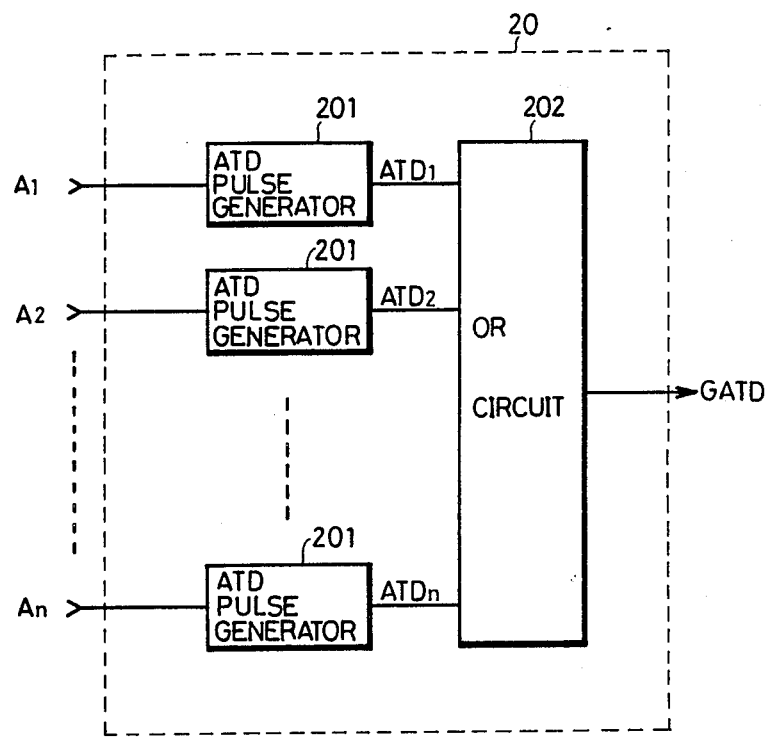
FIG. 2C is a block diagram showing structure of an address transition detector shown in FIGS. 1, 7 and 11.
Figure 3:
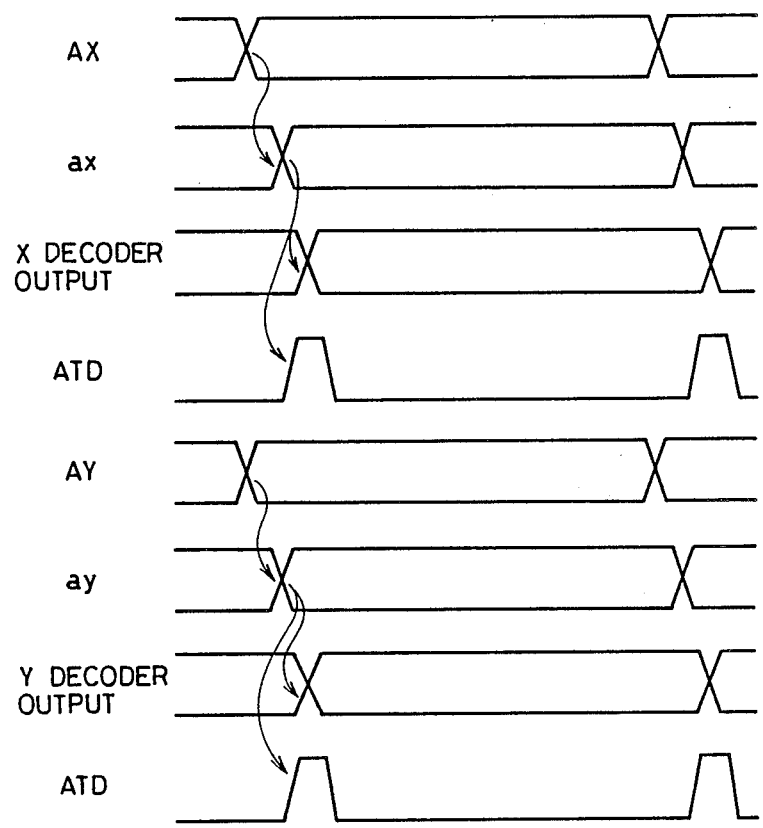
FIG. 3 is a timing chart showing the operation timing of an address buffer, an address decoder and the like shown in FIGS. 1, 7 and 11.

Additionally, in the above described embodiment, the write inhibiting signal WI is made longer than the pulse width of the equalize signal BLEQ for the bit line pair BL and $\overline{BL}$. However, the write inhibiting signal WI may be made longer than an equalize signal IOEQ for a pair of input/output lines I/O and $\overline{I/O}$, as shown in FIG. 2A. In addition, the write inhibiting signal WI may be made longer than the pulse width of a precharging signal for precharging a line which is not pair, such as a data bus DB.

As described in the foregoing, according to the present embodiment, the pulse width of the write inhibiting signal WI is increased, as compared with that of the equalize signal BLEQ. Thus, if a write operation is performed with the write enable signal $\overline{WE}$ being fixed at the "L" level, data can be written to only a desired memory cell without increasing the access times.

Figure 11:
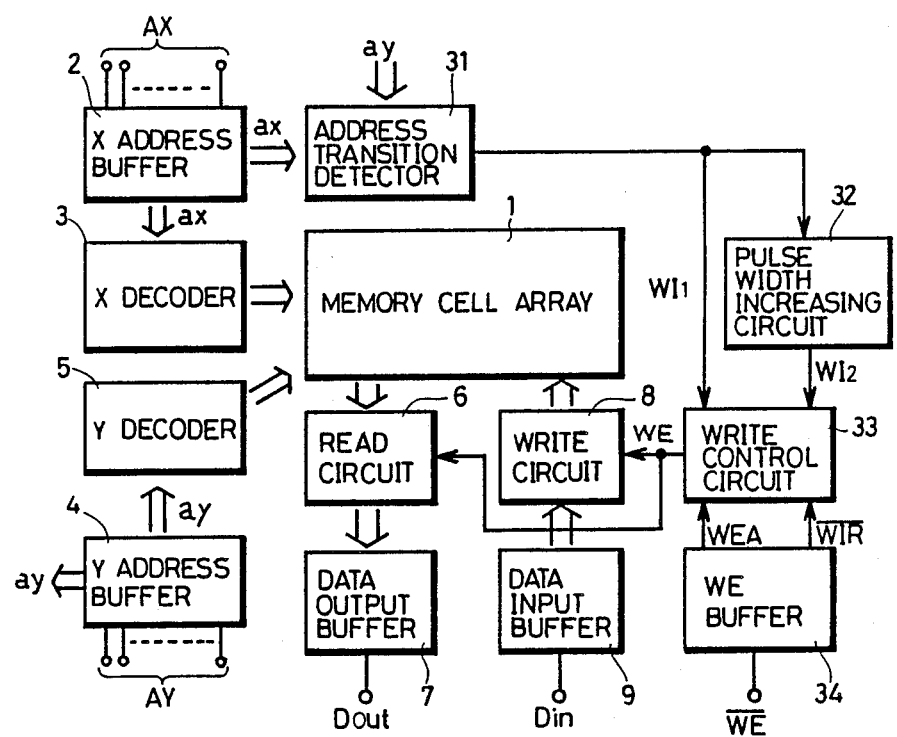
FIG. 11 is a block diagram showing structure of an SRAM according to another embodiment of the present invention.

FIG. 11 is a block diagram showing structure of an SRAM according to another embodiment of the present invention.

In FIG. 11, an ATD generating circuit 31 is responsive to the change of the address signals ax and ay applied from an X address buffer 2 and a Y address buffer 4 for generating a first write inhibiting signal WI1 and applying the same to a pulse width increasing circuit 32 and a write control circuit 33. The pulse width increasing circuit 32 generates a second write inhibiting signal WI2 obtained by increasing the pulse width of the first write inhibiting signal WI1 and applies the same to the write control circuit 33. On the other hand, a $\overline{WE}$ buffer 34 is responsive to a write enable signal $\overline{WE}$ externally applied for generating a buffer output signal WEA which is obtained by waveform-shaping and inverting the write enable signal $\overline{WE}$ and generating a write inhibit releasing signal $\overline{WIR}$, and applying the same to the write control circuit 33. The write control circuit 33 is responsive to the first and second write inhibiting signals WI1 and WI2, the buffer output signal WEA and the write inhibit releasing signal $\overline{WIR}$ for generating an internal write signal WE and applying the same to a write circuit 8 and a read circuit 6. The write circuit 8 operates when the write signal WE is at an "H" level while the read circuit 6 operates when it is at an "L" level. More specifically, when the internal write signal WE is at the "L" level, the write operation is inhibited.

Structure and operations of the other portions of the SRAM shown in FIG. 11 are the same as those of the SRAM shown in FIG. 7. In addition, structure of the ATD generating circuit 31 is the same as that shown in FIG. 2C. Furthermore, structure and an operation of the pulse width increasing circuit 32 are the same as those shown in FIGS. 8 and 9.

Figure 12:
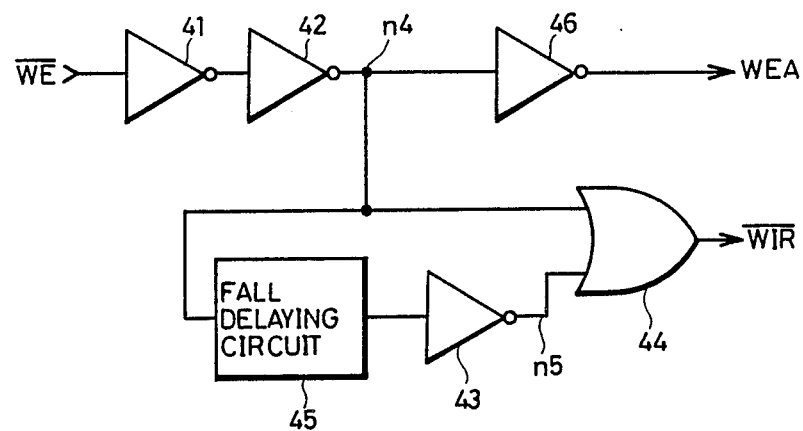
FIG. 12 is a circuit diagram showing structure of a WE buffer shown in FIG. 11.
Figure 13:
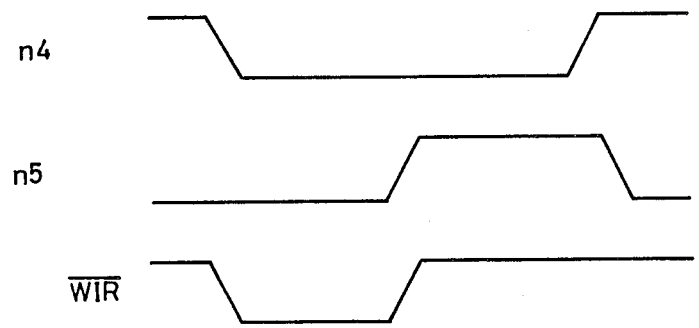
FIG. 13 is a timing chart for explaining an operation of the WE buffer shown in FIG. 12.

FIG. 12 is a block diagram showing an example of structure of a $\overline{WE}$ buffer 34, and FIG. 13 is a waveform diagram for explaining an operation of the WE buffer 34.

In FIG. 12, the write enable signal $\overline{WE}$ externally applied is applied to a node n4 through inverters 41 and 42 and further inverted by an inverter 46, to be outputted as the buffer output signal WEA. The node n4 is connected to one input terminal of an OR circuit 44, as well as to an input terminal of a fall delaying circuit 45. The fall delaying circuit 45 has its output terminal connected to the other input terminal of the OR circuit 44 through an inverter 43. The write inhibit releasing signal $\overline{WIR}$ is outputted from an output terminal of the OR circuit 44.

As shown in FIG. 13, when a potential of the node n4 falls to the "L" level, a potential of a node n5 rises from the "L" level to the "H" level after delay of a constant time period. Thus, the write inhibit releasing signal $\overline{WIR}$ outputted from the OR circuit 44 falls to the "L" level simultaneously with the buffer output signal WEA while rising to the "H" level simultaneously with the potential of the node n5.

Figure 14:
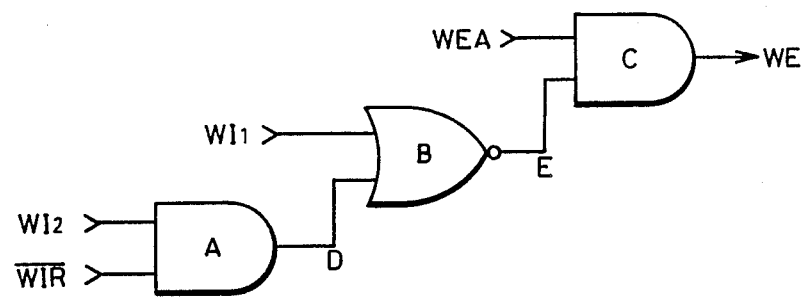
FIG. 14 is a circuit diagram showing structure of a write control circuit shown in FIG. 11.
Figure 15:
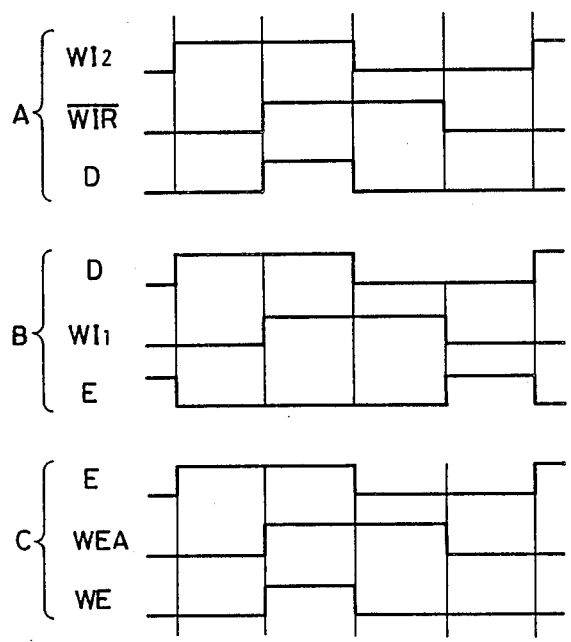
FIG. 15 is a diagram showing the logical state for explaining an operation of each portion of the write control circuit shown in FIG. 14.

FIG. 14 is a circuit diagram showing an example of structure of the write control circuit 33, and FIG. 15 is a diagram for explaining the logical relation of portions of the write control circuit 33.

In FIG. 14, the second write inhibiting signal WI2 is applied to one input terminal of an AND circuit A and the write inhibit releasing signal $\overline{WIR}$ is applied to the other input terminal thereof. When both the second write inhibiting signal WI2 and the write inhibit releasing signal $\overline{WIR}$ are at the "H" level as shown in FIG. 15, an output signal D of the AND circuit A attains the "H" level. The output signal D of the AND circuit A is applied to one input terminal of an NOR circuit B and the first write inhibiting signal WI1 is applied to the other input terminal thereof. When the output signal D or the first write inhibiting signal WI1 attains the "H" level as shown in FIG. 15, an output signal E of the NOR circuit B attains the "L" level. The output signal E of the NOR circuit B is applied to one input terminal of an AND circuit C and the buffer output signal WEA is applied to the other input terminal thereof. When both the output signal E and the buffer output signal WEA are at the "H" level as shown in FIG. 15, the write signal WE outputted from the AND circuit C attains the "H" level.

Thus, in the AND circuit A, if the second write inhibiting signal WI2 is at the "H" level (writing is inhibited) while the write inhibit releasing signal $\overline{WIR}$ attains the "L" level (write inhibition is released), the output signal D attains the "L" level, so that write inhibition is released, i.e., writing becomes possible. In addition, in the NOR circuit B, if the output signal D is at the "L" level so that writing is possible while the first write inhibiting signal WI1 is at the "H" level (writing is inhibited), the output signal E attains the "L" level, so that writing becomes impossible. Furthermore, in the AND circuit C, only when both the output signal E and the buffer output signal WEA are at the "H" level, i.e., writing is possible, the internal write signal WE attains the "H" level, so that writing becomes possible.

Figure 16:
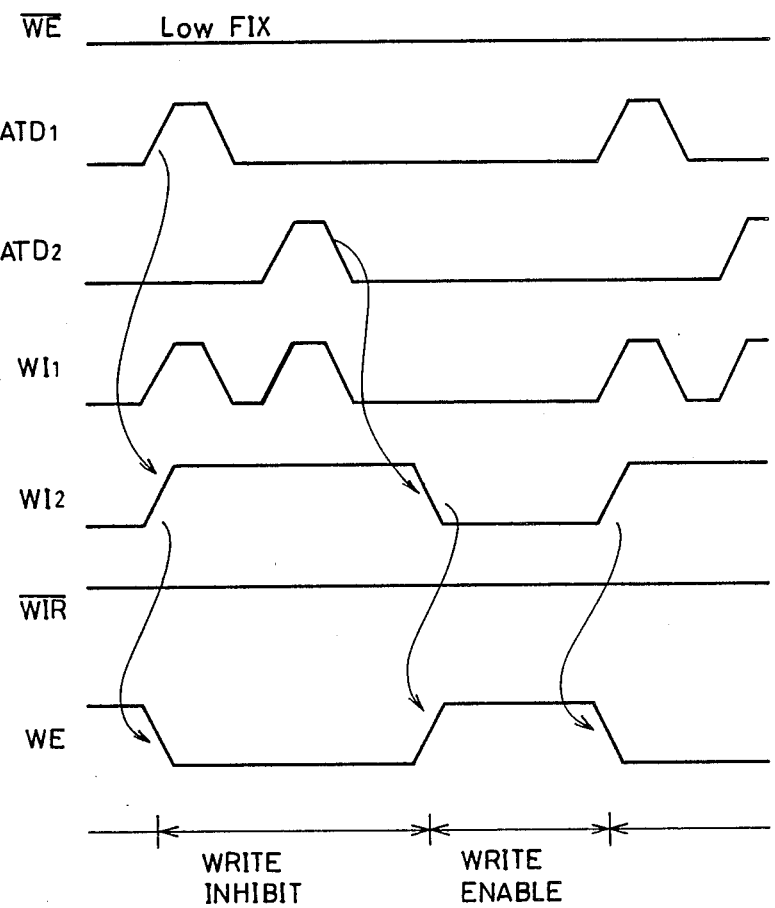
FIG. 16 is a timing chart for explaining an example of a write operation of the SRAM shown in FIG. 11.
Figure 17:
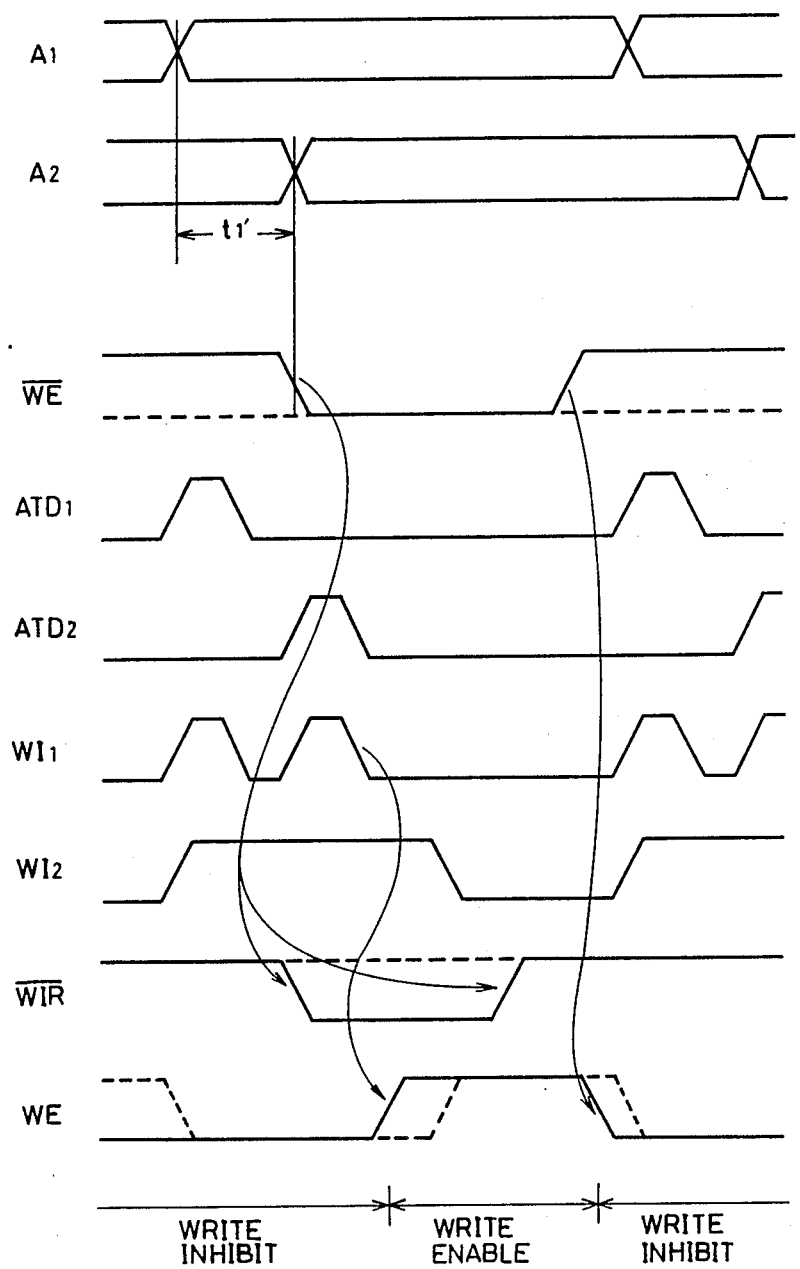
FIG. 17 is a timing chart for explaining another example of a write operation of the SRAM shown in FIG. 11.

Referring now to waveform diagrams of FIGS. 16 and 17, description is made on the write operation of the SRAM according to the embodiment shown in FIG. 11.

FIG. 16 illustrates a case in which a write operation of data is performed with the write enable signal $\overline{WE}$ being fixed at the "L" level before the change of the address signal. Address skew represented by the period t1' occurs between address signals A1 and A2. In the address transition detector 31, a one-shot pulse ATD1 is generated in response to the change of the address signal A1 while a one-shot pulse ATD2 is generated in response to the change of the address signal A2. The address transition detector 31 outputs the first write inhibiting signal WI1 obtained by ORing the one-shot pulses ATD1 and ATD2. If the address skew period t1' is long, the first write inhibiting signal WI1 is divided into two pulses, as shown in FIG. 16. The pulse width increasing circuit 32 increases the pulse width of the first write inhibiting signal WI1, to output the same as the second write inhibiting signals WI2. The second write inhibiting signal WI2 becomes a single long pulse having no period at the "L" level therein. In this case, since the write enable signal $\overline{WE}$ has been fixed at the "L" level, the write inhibit releasing signal $\overline{WIR}$ and the buffer output signal WEA has been fixed at the "H" level. Thus, the internal write signal WE falls to the "L" level in response to the rise of the second write inhibiting signal WI2 while rising to the "H" level in response to the fall of the second write inhibiting signal WI1. Consequently, the write operation is inhibited in the address skew period t1'. As a result, data is never erroneously written to a memory cell transiently selected during the address skew period t1'. This operation is the same as that according to the embodiment shown in FIG. 7. When the pulse width of the second write inhibiting signal WI2 is larger, a margin can be provided for the address skew period t1'. However, if it is too large, the period at the "L" level of the internal write signal WE, i.e., the time period during which writing is possible becomes too short, so that the write operation can not be normally performed. Thus, in consideration of the margin for the address skew and a cycle time, it is necessary to make the pulse width of the second write inhibiting signal WI2 as large as possible.

FIG. 17 illustrates a write operation in which the write enable signal $\overline{WE}$ is made to be the "L" level after the change of address signal.

In this case, the write enable signal $\overline{WE}$ performs a clock operation. The write inhibit releasing signal $\overline{WIR}$ falls to the "L" level in response to the fall of the write enable signal $\overline{WE}$ so that write inhibition is released. However, when the first write inhibiting signal WI1 is at the "H" level, the internal write signal WE remains at the "L" level. The reason is that the period of several nano second is required for precharging bit lines after the change of address signal so that a write operation is not performed in the period. The internal write signal WE rises to the "H" level in response to the fall of the first write inhibiting signal WI1 to the "L" level, so that writing becomes possible. Thereafter, the internal write signal WE falls to the "L" level in response to the rise of the write enable signal $\overline{WE}$.

If the internal write signal WE rises to the "H" level in response to the fall of the second write inhibiting signal WI2, the period during which the internal write signal WE is at the "H" level is short when the time period from the change of the address signals to the rise of the write enable signal $\overline{WE}$ is short, so that a normal write operation may not be performed. However, according to the present embodiment, since write inhibition by the second write inhibiting signal WI2 is released and the internal write signal WE rises in response to the fall of the first write inhibiting signal WI1, a sufficient write time period is ensured. In this case, even if the period at the "L" level appears during the period at the "H" level of the first write inhibiting signal WI1, the write enable signal $\overline{WE}$ is at the "H" level in the period, so that data is never written to a memory cell transiently selected.

Figure 18:
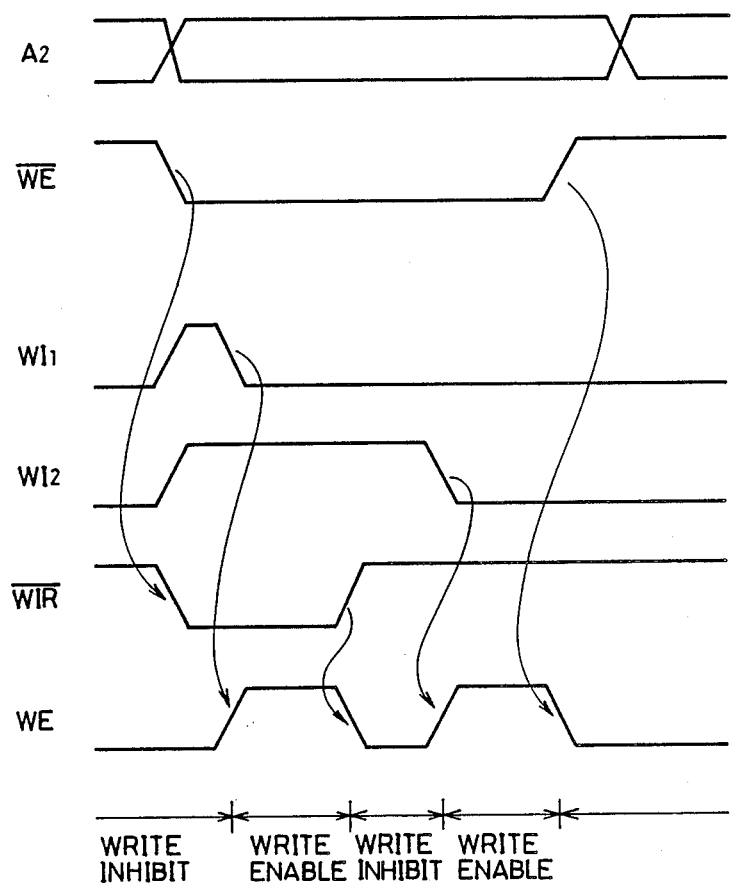
FIG. 18 is a timing chart for explaining the pulse width of a write inhibit releasing signal $\overline{WIR}$ in the SRAM shown in FIG. 11.

As shown in FIG. 18, it is assumed that the write enable signal $\overline{WE}$ falls simultaneously with or slightly earlier than the change of the address signal A2. In this case, if the pulse width of the write inhibit releasing signal $\overline{WIR}$ is smaller than that of the second write inhibiting signal WI2, the internal write signal WE falls once to the "L" level, so that a sufficient write time period is not ensured. Thus, the pulse width of the write inhibit releasing signal $\overline{WIR}$ must be set to be larger than the pulse width of the second write inhibiting signal WI2.

Figure 19:
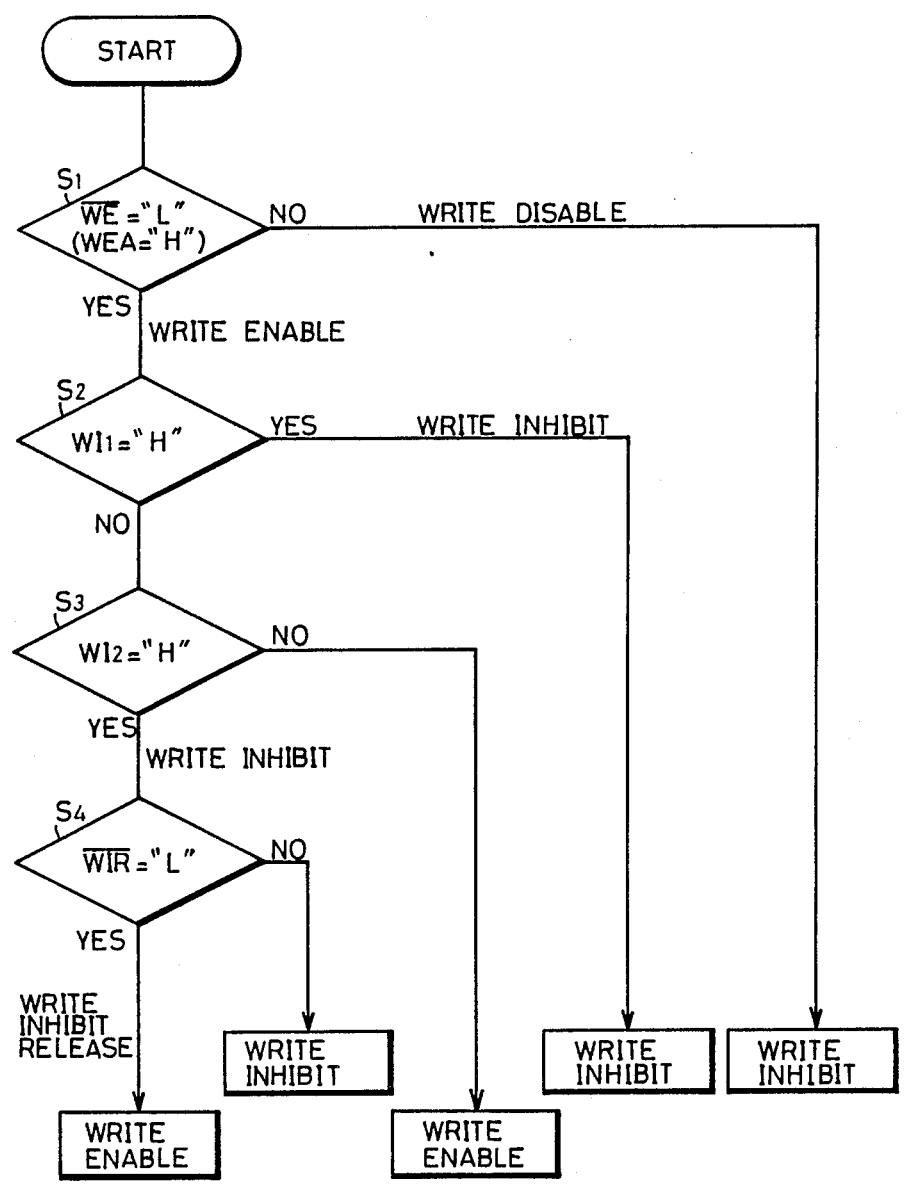
FIG. 19 is a flow chart for explaining the operation of the SRAM shown in FIG. 11.

Referring now to a flow chart of FIG. 19, description is made on the operation of the SRAM according to the above described embodiment.

In the step S1, when the write enable signal $\overline{WE}$ is at the "H" level, a write operation can not be performed. When the write enable signal $\overline{WE}$ is at the "L" level, a judgment shown in the step S2 is made. In the step S2, when the first write inhibiting signal WI1 is at the "H" level, the write operation is inhibited. When the first write inhibiting signal WI1 is at the "L" level, a judgment shown in the step S3 is made. In the step S3, when the second write inhibiting signal WI2 is at the "L" level, the write operation can be performed. When the second write inhibiting signal WI2 is at the "H" level, a judgment shown in the step S4 is made. In the step S4, when the write inhibit releasing signal $\overline{WIR}$ is at the "H" level, the write operation is inhibited. When the write inhibit releasing signal $\overline{WIR}$ is at the "L" level, the write operation can be performed.

In the above described embodiment, the internal write signal WE is generated from the write control circuit 33 in response to the first write inhibiting signal WI1, the second write inhibiting signal WI2, the write inhibit releasing signal $\overline{WIR}$ and the buffer output signal WEA, so that the operation of the write circuit 8 is controlled by the internal write signal WE. However, the signals WI1, WI2, $\overline{WIR}$ and WEA may be inputted to the write circuit 8 so that the operation of the write driver for driving the bit line pair BL and $\overline{BL}$ in the memory cell array 1 is inhibited in response to the signals.

As described in the foregoing, according to the present embodiment, in the write operation in which the write enable signal $\overline{WE}$ has been fixed at the "L" level before the change of address signal, data can be written to a desired memory cell without increasing the access time if the address skew period is long. In addition, in the write operation in which the write enable signal $\overline{WE}$ is made to be the "L" level after the change of address signal, a sufficient write time period is ensured in the chip, so that a normal write operation can be performed.

Although in the above described embodiment, description was made on a case in which the present invention is applied to the SRAM, the present invention can be applied to a dynamic random access memory which operates in a static column mode.

As described in the foregoing, according to the present invention, a semiconductor memory device with first access times can be obtained. In addition, a semiconductor memory device can be obtained in which a write operation is performed at high speed without erroneously writing data to a memory cell transiently selected in an address skew period. Furthermore, a semiconductor memory device can be obtained in which the write operation can be completely inhibited in the address skew period even in an operation in which a write enable signal externally applied is fixed in a write state before the change of address signal. Additionally, a semiconductor memory device can be obtained in which the write time period is ensured during which the write operation is performed at high speed without erroneously writing data to the other memory cells in the operation in which the write enable signal externally applied is fixed in the write state before the change of address signal and the write operation is normally performed in an operation in which the write enable signal is fixed in the write state after the change of address signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells,
   selecting means responsive to a plurality of column line and row line address signals externally applied for selecting any of said plurality of memory cells, corresponding column line and row line address signals being offset in time by an address skew time period,
   writing means for writing data to a memory cell selected by said selecting means, a plurality of address transition detecting means responsive to each of said plurality of column line and row line signals for generating one-shot pulses, first signal generating means responsive to the one-shot pulses from said plurality of address transition detecting means for generating a first pulse signal, second signal generating means responsive to said first pulse signal for increasing the pulse width of said first pulse signal to exceed said address skew time period and outputting the same as a second signal, and write inhibiting means responsive to said second signal from said second signal generating means for rendering said writing means inactive during second signal pulse.

2. A semiconductor memory device according to claim 1, which further comprises at least one bit line pair connected to each cell of said plurality of memory cells, and equalizing means responsive to said first signal from said first signal generating means for equalizing potentials of said at least one bit line pair.

3. A semiconductor memory device according to claim 1, which further comprises:

a plurality of bit line pairs each connected to a cell group of said plurality of memory cells, a pair of input/output lines selectively coupled to one pair, of said plurality of bit line pairs, and equalizing means responsive to said first signal from said first potential generating means for equalizing potentials of said pair of input/output lines.

4. A semiconductor memory device according to claim 1, which further comprises a plurality of bit line pairs each connected to a cell group of said plurality of memory cells, a pair of input/output lines selectively coupled to one pair, of said plurality of bit line pairs, a sense amplifier for amplifying the potential difference between said pair of input/output lines, a data bus coupled to an output from said sense amplifier, and precharging means responsive to said first signal from said first said first signal generating means for precharging said data bus to a predetermined potential.

5. A semiconductor memory device according to claim 1, wherein said first signal generating means comprises logical sum means for ORing said one-shot pulses from said plurality of address transition detecting means.

6. A semiconductor memory device according to claim 1, wherein said second signal generating means comprises an input terminal coupled to said first pulse signal, delay means for outputting a signal which changes from a first logical level to a second logical level in response to the start of said first signal applied to said input terminal while changing gently from said second logical level to said first logical level in response to the end of said first signal, and inverting means for inverting said signal outputted from said delay means.

7. A semiconductor memory device according to claim 6, wherein said delay means comprises a node connected to said inverting means, a plurality of field effect elements each having a first conductivity type channel, said elements coupled in series between a potential of said first logical level and said node and each of said elements having a gate connected to said input terminal, a field effect element having a second conductivity type channel and coupled between a potential of said second logical level and said node and having a gate connected to said input terminal, and capacitance means coupled between the potential of said second logical level and said node.

8. A semiconductor memory device according to claim 1, which further comprises inhibit releasing signal generating means responsive to the start of a write enable signal externally applied for generating an inhibit releasing signal having a predetermined pulse width, said write inhibiting means rendering said writing means active in response to said inhibit releasing signal and the end of said first signal while rendering said writing means inactive in response to the end of said write enable signal.

9. A semiconductor memory device according to claim 8, wherein the pulse width of said inhibit releasing signal is larger than the pulse width of said second signal.

10. A semiconductor memory device according to claim 1, wherein each of said plurality of memory cells comprises a static type memory cell.

11. A semiconductor memory device comprising:

a plurality of memory cells, selecting means responsive to a plurality of column line and row line address signals externally applied for selecting any of said plurality of memory cells, corresponding column line and row line address signals being offset in time by an address skew time period, writing means for writing data to a memory cell selected by said selecting means, a plurality of address transition detecting means responsive to each of said plurality of column line and row line signals for generating one-shot pulses, first signal generating means responsive to the one-shot pulses from said plurality of address transition detecting means for generating a first pulse signal, second signal generating means responsive to said first pulse signal for increasing the pulse width of said first pulse signal to exceed said address skew time period and outputting the same as a second pulse signal, write inhibiting means responsive to said second pulse signal from said second signal generating means for rendering said writing means inactive during the second pulse signal, inhibit releasing signal generating means responsive to the start of a write enable signal externally applied for generating an inhibit releasing signal having a predetermined pulse width, said write inhibiting means rendering said writing means active in response to said inhibit releasing signal and the end of said first pulse signal while rendering said writing means inactive in response to the end of said write enable signal, delay means for generating a signal which changes from a first logical level to a second logical level after delay of a predetermined time period from the start of said write enable signal while changing from said second logical level to said first logical level in response to the end of said write enable signal, and logical sum means for ORing said write enable signal and said first logical level of said signal from said delay means to output the same as said inhibit releasing signal.

12. A semiconductor memory device comprising:
   a plurality of memory cells,
   selecting means responsive to a plurality of column line and row line address signals externally applied for selecting any of said plurality of memory cells, corresponding column line and row line address signals being offset in time by an address skew time period,
   writing means for writing data to a memory cell selected by said selecting means,
   a plurality of address transition detecting means responsive to each of said plurality of column line and row line signals for generating one-shot pulses,
   first signal generating means responsive to the one-shot pulses from said plurality of address transition detecting means for generating a first pulse signal,
   second signal generating means responsive to said first pulse signal for increasing the pulse width of said first pulse signal to exceed said address skew time period and outputting the same as a second pulse signal,
   write inhibiting means responsive to said second pulse signal from said second signal generating means for rendering said writing means inactive during the second pulse signal,
   inhibit releasing signal generating means responsive to the start of a write enable signal externally applied for generating an inhibit releasing signal having a predetermined pulse width,
   said write inhibiting means rendering said writing means active in response to said inhibit releasing signal and the end of said first pulse signal while rendering said writing means inactive in response to the end of said write enable signal,
   first logical product means for ANDing an inverted signal of said inhibit releasing signal and said second signal,
   logical sum means for ORing an output of said first logical product means and said first pulse signal, and
   second logical product means for ANDing an inverted signal of an output of said logical sum means and said write enable signal to output the same as an internal write enable signal,
   said writing means operating in response to said internal write enable signal.

13. A method for controlling a semiconductor memory device comprising a plurality of memory cells; selecting means responsive to a plurality of address signals externally applied for selecting any of said plurality of memory cells, said address signals comprising corresponding column line and row line signals offset in time by an address skew time period; writing means for writing data to a memory cell selected by said selecting means; and a plurality of address transition detecting means responsive to said plurality of address signals for generating a plurality of one-shot pulses, comprising the steps of:
   generating a first signal in response to the one-shot pulses from said plurality of address transition detecting means,
   increasing the pulse width of said first signal to exceed said address skew time period and outputting the same as a second signal, and
   rendering said writing means inactive in response to said second signal.

14. The method according to claim 13, which further comprises the steps of:
   generating an inhibit releasing signal having a predetermined pulse width in response to the start of a write enable signal externally applied, and
   rendering said writing means active in response to said inhibit releasing signal and the end of said first signal while rendering said writing means inactive in response to the end of said write enable signal.

15. A static semiconductor memory device comprising:
   a plurality of word lines,
   a plurality of bit line pairs arranged intersecting with said plurality of word lines,
   a plurality of memory cells each provided at each of intersections of said plurality of word lines and said plurality of bit line pairs,
   an X decoder responsive to a plurality of X address signals for selecting any of said plurality of word lines,
   a Y decoder responsive to a plurality of Y address signals for selecting any of said plurality of bit line pairs,
   said X address signals and Y address signals being offset in time by an address skew time period,
   writing means for writing data to a memory cell provided at an intersection of a word line selected by said X decoder and a bit line pair selected by said Y decoder,
   reading means for reading out data to be stored in the memory cell provided at the intersection of the word line selected by said X decoder and the bit line pair selected by said Y decoder,
   a plurality of address transition detecting means responsive to said plurality of X address signals or said plurality of Y address signals for generating a plurality of one-shot pulses,
   first signal generating means responsive to the one-shot pulses from said plurality of address transition detecting means for generating a first signal,
   second signal generating means responsive to said first signal from said first signal generating means for increasing the pulse width to exceed said address skew time period of said first signal and outputting the same as a second signal, and
   control means for rendering said writing means active when a write enable signal is applied from the exterior and said second signal is not applied while rendering said reading means active when said write enable signal is not applied.

16. A static semiconductor memory device comprising:
   a plurality of word lines,
   a plurality of bit line pairs arranged intersecting with said plurality of word lines,
   a plurality of memory cells each provided at each of intersections of said plurality of word lines and said plurality of bit line pairs,
   an X decoder responsive to a plurality of X address signals for selecting any of said word lines,
   a Y decoder responsive to the plurality of Y address signals for selecting any of said plurality of bit line pairs,
   writing means for writing data to a memory cell provided at an intersection of a word line selected by said X decoder and a bit line pair selected by said Y decoder, reading means for reading out data to be stored in the memory cell provided at the intersection of the word line selected by said X decoder and the bit line pair selected by said Y decoder, a plurality of address transition detecting means responsive to said plurality of X address signals and said plurality of Y address signals for generating one-shot pulses, first signal generating means responsive to the one-shot pulses from said plurality of address transition detecting means for generating a first signal pulse, second signal generating means responsive to said first signal pulse from said first signal generating means for increasing the pulse width of said first signal pulse and outputting the same as a second signal pulse, and inhibit releasing signal generating means responsive to the start of a write enable signal pulse externally applied for generating an inhibit releasing signal pulse having a predetermined pulse width, and control means responsive to said first signal pulse, said second signal pulse, said inhibit releasing signal pulse and said write enable signal pulse for selectively rendering said writing means and said reading means active, said control means rendering said reading means active when said write enable signal pulse is present and said second signal pulse is absent, rendering said writing means inactive when said write enable signal pulse and said second signal pulse are present and said inhibit releasing signal pulse is absent, rendering said writing means active when said write enable signal pulse, said second signal pulse and said inhibit releasing signal pulse are present and said first signal pulse is absent, and rendering said writing means inactive when said write enable signal pulse, said second signal pulse, said inhibit releasing signal pulse and said first signal pulse are present.

17. A method for controlling a semiconductor memory device comprising a plurality of memory cells; selecting means responsive to a plurality of address signals externally applied for selecting any of said plurality of memory cells; writing means for writing data to a memory cell selected by said selecting means; and a plurality of address transition detecting means responsive to said plurality of address signals for generating a plurality of one-shot pulses, comprising the steps of:

generating a first signal pulse in response to the one-shot pulses from said plurality of address transition detecting means, increasing the pulse width of said first signal pulse and outputting the same as a second signal pulse, generating an inhibit releasing signal pulse having a predetermined pulse width in response to the start of a write enable signal pulse externally applied, rendering said writing means inactive when said write enable signal pulse is absent, rendering said writing means active when said write enable signal pulse is present and said second signal pulse is absent, rendering said writing means inactive when said write enable signal pulse and said second signal pulse are present and said inhibit releasing signal pulse is absent, rendering said writing means active when said write enable signal pulse, said second signal pulse and said inhibit releasing signal pulse are present and said first signal pulse is absent, and rendering said writing means inactive when said write enable signal pulse, said second signal pulse, said inhibit releasing signal pulse and said first signal pulse are present.

* * * * *